(12) United States Patent
Tatsumi

(10) Patent No.: US 8,729,452 B2
(45) Date of Patent: May 20, 2014

(54) VARIABLE GAIN AMPLIFIER COMPENSATING FREQUENCY RESPONSE THEREOF

(75) Inventor: Taizo Tatsumi, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 211 days.

(21) Appl. No.: 13/401,887

(22) Filed: Feb. 22, 2012

(65) Prior Publication Data
US 2012/0217381 A1 Aug. 30, 2012

(30) Foreign Application Priority Data

Feb. 25, 2011 (JP) ................................. 2011-040098

(51) Int. Cl.
*H03F 3/08* (2006.01)
*H03G 3/20* (2006.01)

(52) U.S. Cl.
USPC ......... 250/214 A; 330/308; 330/254; 330/278

(58) Field of Classification Search
USPC ............... 250/214 A; 330/278, 291, 254, 308
See application file for complete search history.

(56) References Cited

U.S. PATENT DOCUMENTS

| 7,335,872 | B2* | 2/2008 | Fukuda et al. ............ 250/214 A |
| 7,449,669 | B2* | 11/2008 | Sakura ....................... 250/214 A |
| 7,605,660 | B1 | 10/2009 | Kobayashi |
| 8,150,272 | B2* | 4/2012 | Ossieur et al. ................ 398/202 |

* cited by examiner

*Primary Examiner* — Tony Ko
(74) *Attorney, Agent, or Firm* — Smith, Gambrell & Russell, LLP

(57) ABSTRACT

A variable gain amplifier canceling the dependence of the frequency bandwidth thereof on the gain is disclosed. The variable gain amplifier includes a differential stage with a cascade transistor put between an amplifying transistor and a load resistor. The amplifier further includes a current supplier and a current extractor. The current supplier extracts a current flowing in the second transistor by supplying an additional current to the amplifying transistor. The current extractor adds the additional current flowing in the load resistor which is extracted by the additional current by the current supplier. The bias condition of the load resistor is kept substantially constant independent of the equivalent impedance of the cascade transistor.

14 Claims, 5 Drawing Sheets

VARIABLE GAIN AMPLIFIER COMPENSATING FREQUENCY RESPONSE THEREOF

BACKGROUND OF THE INVENTION

1. Field of the Invention

The present invention relates to a variable gain amplifier.

2. Related Prior Arts

Optical receivers applicable to the optical communication system generally comprises a photodiode (PD), typically PIN-PD or an avalanche PD (APD), and a trans-impedance amplifier (TIA) to convert a photocurrent generated by the PD into a voltage signal. Among the optical receives, those applied in the optical system with a long distance, or the dense wavelength division multiplexing (DWDM) system, are required to have a wide dynamic range for the input optical power to control the signal threshold level and to compensate the dispersion degradation electrically in units downstream to the optical receivers. Conventional TIAs often implements with, what is called as, the auto-gain control (AGC) to suppress the degradation of the output voltage even for greater optical inputs. The AGC feedbacks a magnitude of the output of the optical receiver to a variable gain amplifier to keep the magnitude thereof in constant. Also, conventional optical receives often have a type of the Cherry Hooper arrangement to secure a wider frequency bandwidth.

The U.S. Pat. No. 7,605,660, has disclosed a TIA 108 with the Cherry-Hooper arrangement shown FIG. 5. The Cherry-Hooper circuit 108, which is popular as an amplifier having a wide frequency band, is often used in an amplifier in a frequency band around and over 40 Gbps. The pair of transistors, $Q_{60}$ and $Q_{62}$, constitutes the first amplifying stage with two emitter resistors, $R_{LEE60}$ and $R_{LEE62}$, where they enhances the linearity of the first amplifying stage. Two load resistors, $R_{L64}$ and $R_{L66}$, determine output amplitude of the first amplifying unit cooperating with the constant current source $I_{CS60}$. The second amplifying stage, which includes the second pair of transistors, $Q_{70}$ and $Q_{72}$, directly couples with the output of the first stage. The load resistor of the second pair of transistors, $Q_{70}$ and $Q_{72}$, are divided into two parts; and the output, $V_{OUTP}$ and $V_{OUTN}$, of the second stage are divided thereby and fed to the feedback transistors, $Q_{64}$ and $Q_{66}$. A ratio of resistance of divided resistors, $R_{L80}/R_{L70}$ and $R_{L82}/R_{L72}$, may determine the feedback amount from the second stage to the first stage; that is, the frequency bandwidth widens but the gain thereof decreases when the ratio becomes greater. When the output of the second stage is fully fed back to the feedback transistors, $Q_{64}$ and $Q_{66}$ that is, two resistors, $R_{L70}$ and $R_{L72}$, are short-circuited; the amplifier 108 may operate as a voltage follower. However, in such a condition where the feedback amount is increased, a degradation of the output of the first stage appeared in the collector of the first pair of transistors, $Q_{60}$ and $Q_{62}$, becomes large as the input level increases.

In the Cherry-Hooper circuit, the total gain thereof may be varied by inserting an element showing variable impedance between the first pair of transistors, $Q_{60}$ and $Q_{62}$, and the load resistors, $R_{L64}$ and $R_{L66}$. For instance, connecting a transistor, which is optionally biased in the control electrode thereof to vary the equivalent impedance between two current electrodes, in series to the load resistor, $R_{L64}$ and $R_{L66}$, the voltage gain of the first stage may be varied by changing the bias to the control electrode.

However, when the equivalent impedance of the inserted transistor is varied, which means that the current flowing in the series circuit of the feedback transistor, the load resistor, the inserted transistor, and the transistor of the first pair is also varied; then, the operating condition of the feedback transistor, the load resistor, and the transistor of the first pair is inevitably disordered from the designed and ideal condition. For instance, the trans-conductance gm of the transistors lowers, which may narrows the frequency bandwidth of the amplifier. The present invention is to provide an arrangement of a variable gain amplifier without degrading the frequency bandwidth even when the gain thereof is adjusted.

SUMMARY OF THE INVENTION

One aspect of the present invention relates to a variable gain amplifier that comprises a first stage for amplifying an input signal, a current supplier and a current extractor. The first stage may include a load element, a cascade transistor and a first amplifying transistor, and a constant current source, where they are connected in series between the power supply and the ground. The constant current source may determine a first current flowing in the series circuit above. The current supplier, which may be connected in parallel to the amplifying transistor but in series to the cascade transistor, may extract a second current from the first current flowing in the cascade transistor by supplying the second current to the amplifying transistor. The current extractor, which may be connected in parallel to the cascade transistor but in series to the load element, may supply a third current to the first current flowing in the load element.

In an embodiment of the invention, since the constant current source determines the first current flowing the in the series circuit, the current flowing in the cascade transistor may be resultantly decreased by supplying the second current to the amplifying transistor; that is, the current flowing in the cascade transistor becomes the first current subtracted by the second current by supplying the second current to the amplifying transistor.

Similarly, the current extractor may extract the third current flowing in the load element, which resultantly increases the current flowing in the load element by the third current. Thus, the variable gain amplifier of the embodiment, the current flowing in the amplifying transistor may be kept substantial constant because the constant current source determines the current flowing therein. On the other hand, the current flowing in the load element may be varied by supplying the second current to the amplifying transistor, which resultantly reduces the current flowing in the cascade transistor and the load element. However, the current extractor may extract the current flowing in the load element by the third current, which resultantly increases the total current flowing in the load element; accordingly, the operational condition of the load element becomes invariant even when the cascade transistor varies the condition thereof to change the gain of the amplifier.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified.

DESCRIPTION OF PREFERRED EMBODIMENTS

Next, details of some embodiments of a variable gain differential amplifier according to the present invention will be described as referring to drawings. In the description of the drawings, elements same to each other will be referred by numerals or symbols same to each other without overlapping explanation. Further, elements referred as a transistor include both the bipolar transistor and the field effect transistor (FET) although the description below concentrates on the bipolar transistor. The base, emitter and collector of the bipolar transistor may be replaced in the FET by gate, source, and drain, respectively.

Figure 1:
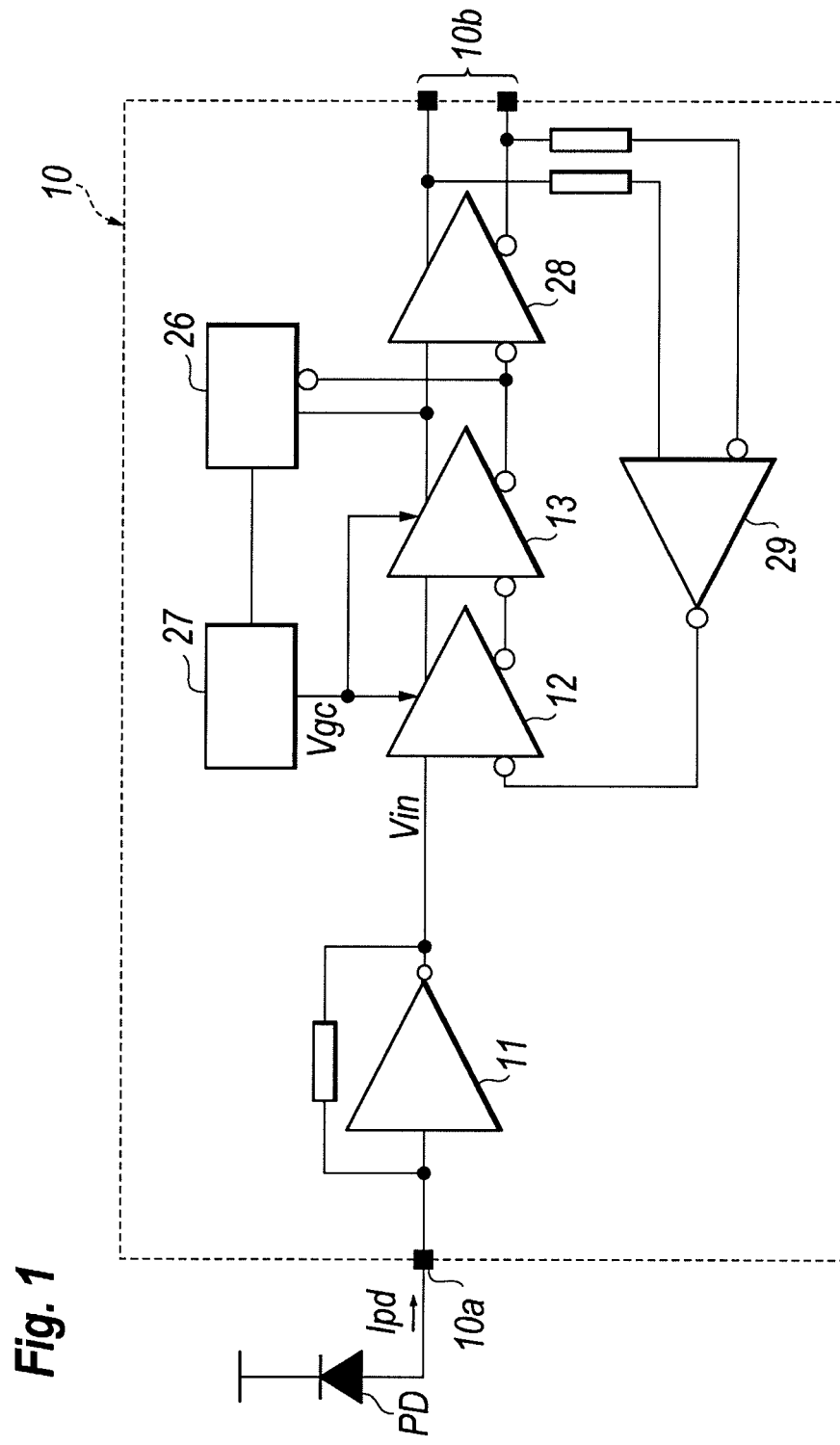
FIG. 1 shows a functional block diagram of an optical receiver according to an embodiment of the present invention.

FIG. 1 shows a functional block diagram of an optical receiver implementing with a differential amplifier of one embodiment of the invention. The optical receiver 10 may convert a photocurrent Ipd generated by a photodiode (PD) into a voltage signal and amplify this voltage signal to output therefrom. The optical receiver 10 includes a TIA 11, two differential amplifiers, 12 and 13, a signal detector 26, a gain controller 27, an offset compensator 29, and an output buffer 28.

Receiving an optical signal, the PD generates the photocurrent corresponding to the optical signal. This photocurrent Ipd enters the TIA 11 via the input terminal 10a of the optical receiver 10. The TIA 11 may convert the photocurrent Ipd to a voltage signal Vin; and this voltage signal Vin is sequentially amplified by the differential amplifiers, 12 and 13, and the output buffer 28. Outputs of the second differential amplifier 13, namely, both the positive phase output and the negative phase output, are led to the signal detector 26 to detect the magnitude of the signals thereby.

The gain controller 27 receives the output of the signal detector 26 to generate a gain control signal Vgc. This control signal Vgc, by being provided to respective differential amplifiers, 12 and 13, may adjust the gain of the differential amplifiers to maintain the magnitude of the outputs from the second differential amplifier 13 in substantially constant. The offset adjustor 29 may cancel the output offset of the output buffer 28 by feeding the outputs therefrom to one of the inputs of the first differential amplifier 12.

Figure 2:
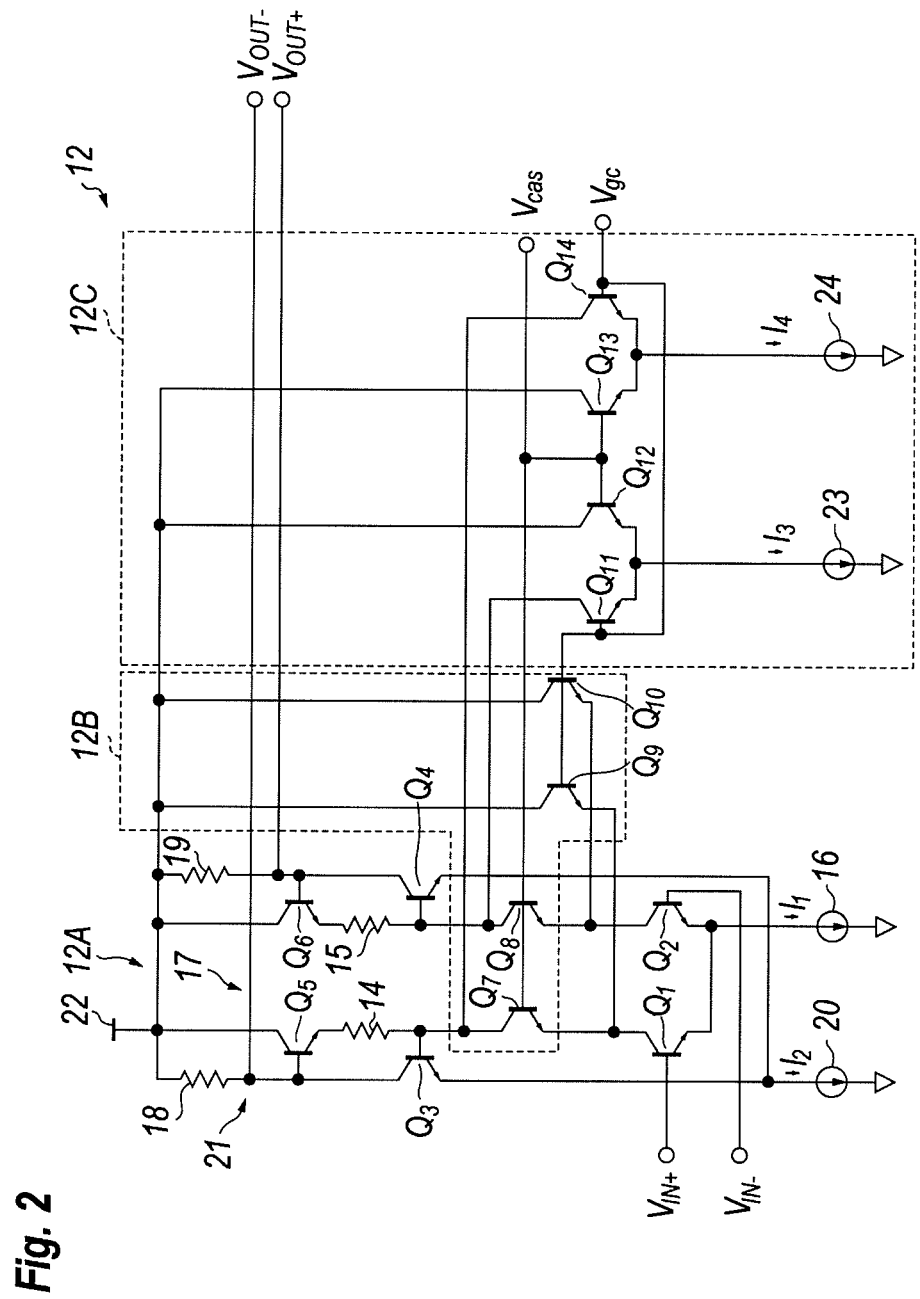
FIG. 2 shows a circuit diagram of a variable gain differential amplifier according to an embodiment of the present invention.

FIG. 2 shows a circuit diagram of the first differential amplifier 12. The second differential circuit 13, and the output buffer 28, may have the same arrangement with that of the first differential amplifier 12 shown in FIG. 2. The differential circuit 12 according to an embodiment of the invention may comprise a differential circuit 12A, a current supplier 12B, and a current extractor 12C.

The differential circuit 12A includes the first differential stage 17 and the second differential stage 21. The former differential stage 17 may comprise a constant current source, 16, the first pair of differential transistors, $Q_1$ and $Q_2$, a pair of cascade transistors, $Q_7$ and $Q_8$, a pair of feedback transistors, $Q_s$ and $Q_6$, a pair of load resistors, 14 and 15, where those circuit elements are connected in series between the power supply 22 and the ground. The latter differential stage 21 may comprise the second pair of differential transistors, $Q_3$ and $Q_4$, a pair of load resistors, 18 and 19, and a current source 20.

The first differential stage 17 connects the common emitter of the transistors, $Q_1$ and $Q_2$, to the current source 16 to sink the current $I_1$ therein. The base of the transistor $Q_1$ receives the voltage signal Vin+, which may be provided from the TIA 11, while, the other transistor $Q_2$ receives the output of the offset compensator, as shown in FIG. 1. Respective collectors of the first pair of transistors, $Q_1$ and $Q_2$, are connected to the load resistor, 14 and 15, via cascade transistors, $Q_7$ and $Q_8$, which are provided in the current supplier 12B. The load resistors, 14 and 15, are biased by the power supply 22 via the feedback transistors, $Q_5$ and $Q_6$. Thus, the first pair of transistors, $Q_1$ and $Q_2$, the load resistors, 14 and 15, and the feedback transistors, $Q_5$ and $Q_6$, are connected in series between the power supply 22 and the ground.

The second differential stage 21 has the current source 20 commonly connected to respective emitters of the second pair of transistors, $Q_3$ and $Q_4$. The second current source 20 sinks the current $I_2$. The second pair of transistors, $Q_3$ and $Q_4$, each connected to the collector of the first paired transistors, $Q_1$ and $Q_2$, receives signals amplified by the first differential stage 17. Respective collectors of the second paired transistors, $Q_3$ and $Q_4$, are supplied with the power supply 22 via the load resistors, 18 and 19. Thus, the load resistors, 18 and 19; the second pair of transistors, $Q_3$ and $Q_4$, and the second current source 20 are connected in series between the power supply 22 and the ground. Each of collectors of the second pair of transistors, $Q_3$ and $Q_4$, not only provides the outputs, $V_{OUT-}$ and $V_{OUT+}$, of the differential amplifier 12; but they are connected to the feedback transistors, $Q_5$ and $Q_6$. That is, the feedback transistors, $Q_5$ and $Q_6$, and the second pair of the transistors, $Q_3$ and $Q_5$, constitute, what is called, the Cherry-Hooper circuit which widens the operational bandwidth of the differential amplifier 12.

The current supplier 12B includes two pairs of transistors, $Q_7$ and $Q_8$; and $Q_9$ and $Q_{10}$. The former pair of transistors, $Q_7$ and $Q_8$, is often called as the cascade transistor. The cascade transistors, $Q_7$ and $Q_8$, are fixedly biased in the base thereof by the reference Vcas; while, the other pair of transistors, $Q_9$ and $Q_{10}$, are optionally biased in the base thereof by the gain control signal Vgc provided from the gain controller 27. The former pair of transistors, $Q_7$ and $Q_8$, is put between the first differential pair of the transistors, $Q_1$ and $Q_2$, and the load resistors, 14 and 15, to stable the collector bias of the transistors, $Q_1$ and $Q_2$; that is, the cascade transistor may suppress an excess change of the collector-emitter bias of the first differential transistors, $Q_1$ and $Q_2$. While, the other pair of transistors, $Q_9$ and $Q_{10}$, are commonly connected to the emitter of the cascade transistor, $Q_7$ and $Q_8$, but biased in the collector thereof directly by the power supply 22. That is, a combination of one of the cascade transistors $Q_7$ and one of other pair of transistors $Q_9$ connected to one of the first pair of the transistors $Q_1$, and another combination of the other cascade transistor $Q_8$ and the other of pair of transistors $Q_{10}$ connected to the other of the first differential pair of the transistors $Q_2$, are connected in parallel to the first current source 16.

The current extractor 12C includes two differential circuits, one of which comprises paired transistors, $Q_{11}$ and $Q_{12}$, with the third current source 23, and the other of which comprises another paired transistors, $Q_{13}$ and $Q_{14}$, with the fourth current source 24. One of respective pair of transistors, $Q_{11}$ and $Q_{14}$, is optionally biased by the gain control signal Vgc and connected in the collector thereof to respective load resistors, 14 and 15, of the first differential stage 17; while the other of paired transistors, $Q_{12}$ and $Q_{13}$, are fixedly biased by the reference Vcas, and also fixedly biased in the collector thereof by the power supply 22. The currents, $I_3$ and $I_4$, generated in the third and fourth current sources, 23 and 24, are preferably equal to the first current $I_1$ of the first differential stage 17. That is, the current extracted by the current extractor 12C may be substantially equal to the current supplied from the current supplier 12B for the first pair of transistors, $Q_1$ and $Q_2$.

Figure 5:
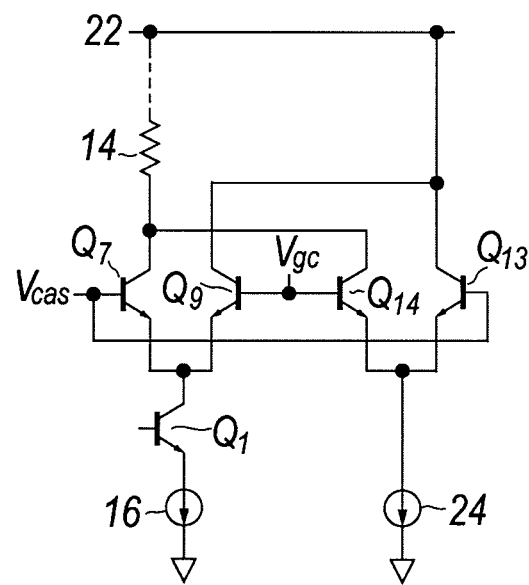
FIG. 5 shows an operating mechanism of the current supply and extraction according to an embodiment of the invention.

The relation between the current supplier 12B and the current extractor 12C may be further described. FIG. 5 extracts the current supplier and the current extractor only for one of the first pair of transistors $Q_1$. The transistor $Q_9$ in the current supplier may supply current, depending on a difference between the gain control signal Vgc and the reference Vcas, to the transistor $Q_1$; accordingly, the current flowing in the cascade transistor $Q_7$ decreases because the current flowing in the transistor Q1 inherently determined by the constant current source 16, which increases the equivalent impedance of the cascade transistor $Q_7$ and the voltage gain of the first differential stage 17. In the present embodiment, the current extractor 12C ($Q_{14}$) may extract the current, whose magnitude is same as that supplied from the current supplier 12B ($Q_9$) to the transistor $Q_1$, from that flowing in the resistor 14 because the current extractor 12C has the differential transistors, $Q_{13}$ and $Q_{14}$, each biased with the condition same as those of the transistors, $Q_7$ and $Q_9$. Accordingly, the operating point regarding to the load resistor 14 may be kept substantially constant independent of the variable gain of the first differential stage.

Thus, according to the variable gain circuit 12 shown in FIG. 2, the input signals, $VI_{N+}$ and $VI_{N-}$, entering the first differential stage, $Q_1$ and $Q_2$, may be differentially amplified with the gain decided by the load resistors, 14 and 15, and the current source 16 to cause the amplified signals. The amplified signals may be secondly amplified by the second differential stage, $Q_3$ and $Q_4$, and not only output from the differential circuit but partially fed back to the load resisters, 14 and 15, via the feedback transistors, $Q_5$ and $Q_6$.

When the current supplier 12B supplies the current in the transistors, $Q_1$ and $Q_2$, of the first differential stage 17, which equivalently decreases the current flowing in the cascade transistors, $Q_7$ and $Q_8$, and in the feedback transistors, $Q_5$ and $Q_6$, to vary the gain of the first differential stage 17, the bias conditions of the load resistors, 14 and 15, and those of the feedback transistors, $Q_5$ and $Q_6$, are inevitably varied to influence the frequency bandwidth of the circuit. The differential circuit 12 of the embodiment, therefore, provides the current extractor 12C to extract the current flowing in the load resistors, 14 and 15, and the feedback transistors, $Q_5$ and $Q_6$, by an amount substantially equal to the magnitude of the current supplied from the current supplier 12B.

Specifically, the current flowing in the feedback transistors, $Q_5$ and $Q_6$, which is equal to the current flowing in the load resistors, 14 and 15, becomes a sum of the current flowing in the transistor $Q_7$ and that flowing in the transistor $Q_{14}$, or a sum of the current flowing in the transistor $Q_8$ and that flowing in the transistor $Q_{11}$. Accordingly, even when the current flowing in the transistor, $Q_7$ and $Q_8$, decreases; the current flowing in the feedback transistors, $Q_5$ and $Q_6$, may be kept constant because the current complimentarily flows in the transistor, $Q_{11}$ and $Q_{14}$. Thus, the bias conditions of the feedback transistors, $Q_5$ and $Q_6$, and those of the load resistors, 14 and 15, become substantially invariant even the gain of the differential circuit varies.

Figure 3:
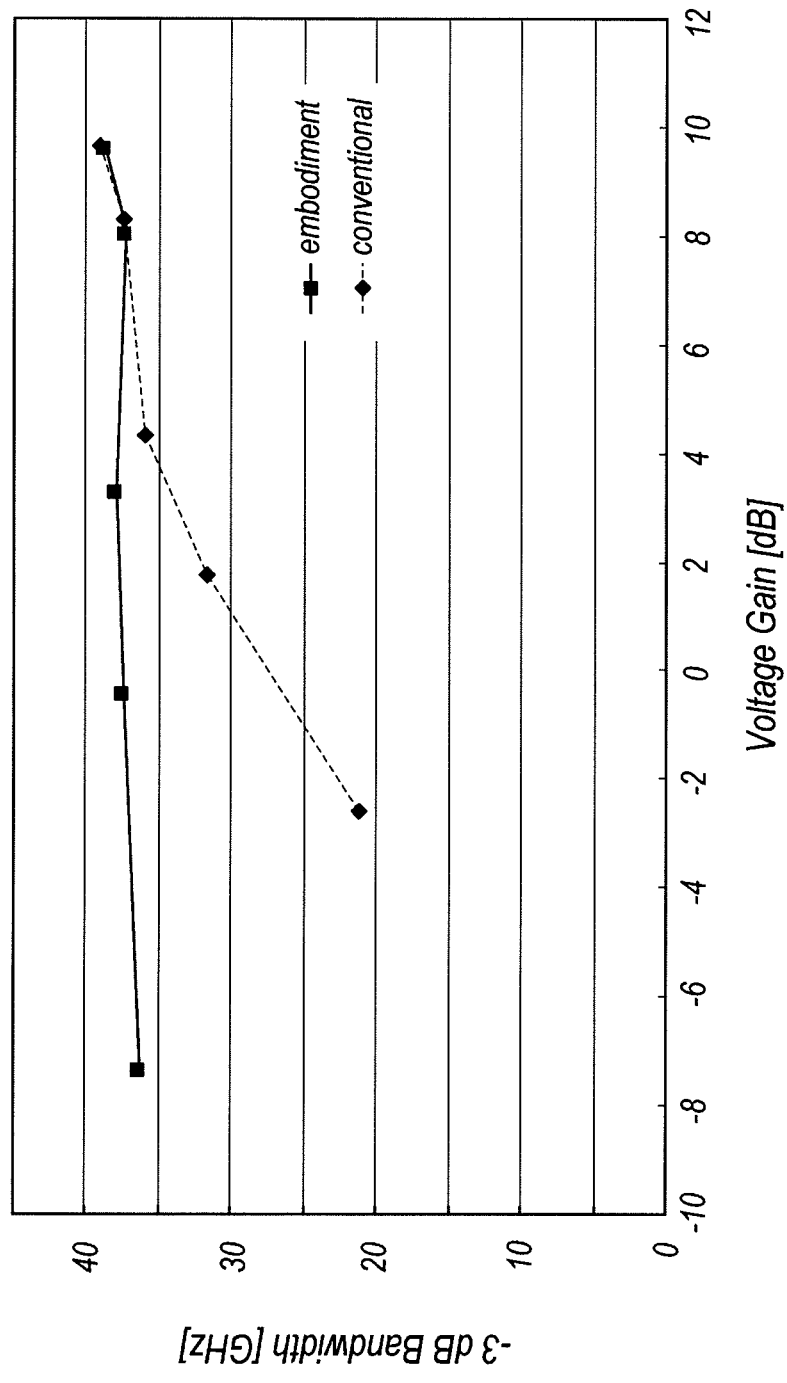
FIG. 3 compares a bandwidth of a variable gain differential amplifier of the present embodiment with that of a conventional amplifier.
Figure 4:
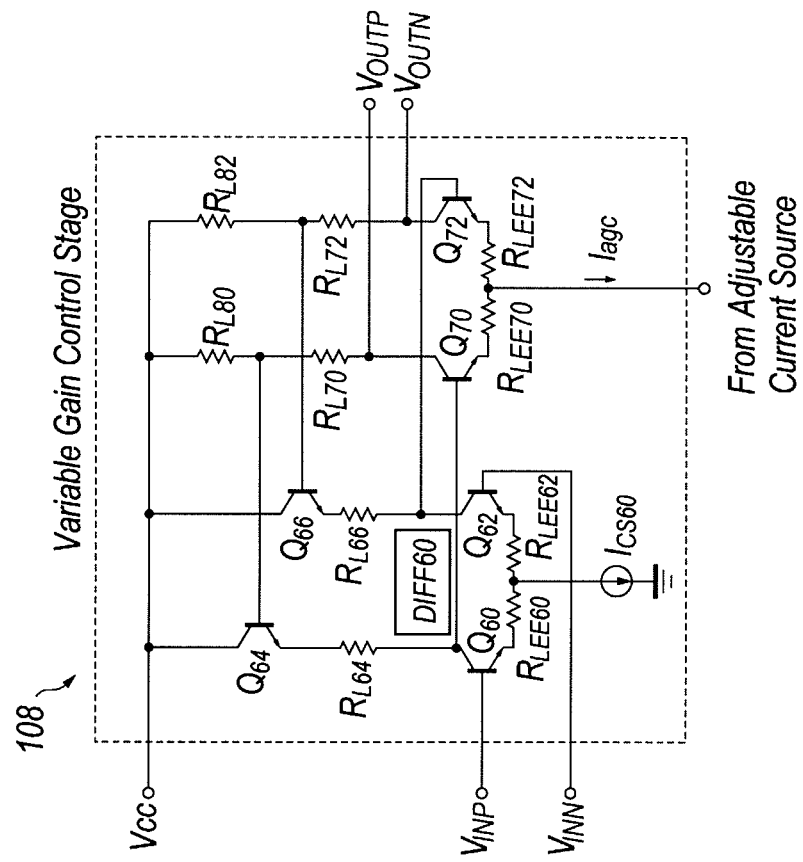
FIG. 4 shows a circuit diagram of a differential amplifier with a conventional Cherry-Hooper arrangement.

FIG. 3 compares the gain-bandwidth characteristic of the differential amplifier 12 with the variable gain function shown in FIG. 2 with a conventional variable gain differential amplifier. The horizontal axis shows the gain varied by the gain control signal Vgc, while, the vertical axis shows the frequency bandwidth at which the gain decreases by 3 dB with respect to that in lower frequencies. The conventional differential amplifier degrades the bandwidth as the gain decreases; while, the amplifier 12 of the present invention may keep the frequency bandwidth substantially in constant even the gain thereof decreases. The spirits of the present invention may be mostly brought in the Cherry-Hooper amplifier because the feedback transistors, $Q_5$ and $Q_6$, operate as an active load element. However, the invention is applicable to an amplifier implementing only with the passive load elements, 14 and 15. Moreover, the specification concentrates on the circuit with the differential arrangement; however, the combination of the current supplier with the current extractor is applicable to a circuit for the single phase amplifier of the Cherry-Hooper type.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A variable gain amplifier, comprising:
   a first stage for amplifying an input signal, the first stage including a load element, a cascade transistor, a first amplifying transistor and a constant current source each connected in series between a power supply and a ground, the constant current source determining a first current flowing in the load element, the cascade transistor, and the amplifying transistor;
   a current supplier connected in parallel to the amplifying transistor and in series to the cascade transistor, the current supplier extracting a second current from the first current flowing in the cascade transistor by supplying the second current to the amplifying transistor; and
   a current extractor connected in parallel to the cascade transistor and in series to the load element, the current extractor supplying a third current to the first current flowing in the load element.

2. The variable gain amplifier of claim 1,
   further comprising a second stage for amplifying an output of the first stage, and a feedback transistor in the first stage,
   wherein feedback transistor is put between the power supply and the load resistor to form an active load for the first amplifying transistor,
   wherein the second stage includes a second amplifying transistor for receiving the output of the first stage pulled out between the cascade transistor and the load resistor, and
   wherein the feedback transistor in the first stage receives an output of the second stage to constitute a Cherry-Hooper circuit.

3. The variable gain amplifier of claim 1,
   wherein the third current is substantially equal to the second current to keep the current flowing in the load resistor substantially constant.

4. The variable gain amplifier of claim 1,
   wherein the first stage, the current supplier, and the current extractor have a differential arrangement.

5. The variable gain amplifier of claim 4,
   wherein the first stage includes a pair of load resistors, a pair of cascade transistors, a pair of amplifying transistors, and the constant current source, wherein the current supplier includes a pair of transistors, and the current extractor includes a pair of transistors and a current source, wherein one of the cascade transistors and one of the transistors of the current supplier constitute a differential circuit with respect to one of the amplifying transistors, and one of the transistors of the current extractor is commonly connected to one of the load resistors, and wherein one of the transistors of the current supplier and one of the transistors of the current extractor are driven by a gain control signal, and one of the cascade transistors and the other of the transistors of the current extractor are driven by a constant reference.

6. The variable gain amplifier of claim 5, further including a second stage with a differential arrangement for amplifying an output of the first stage, and a pair of feedback transistors put between the load resistors and the power supply to form an active load in the first stage, wherein the second stage includes a pair of amplifying transistors and a current source for receiving the output of the first stage, and wherein the feedback transistors receive an output of the second stage to form a Cherry-Hooper circuit.

7. The variable gain amplifier of claim 5, wherein the current source in the current extractor generates a current substantially equal to a current generated by the current source in the first stage.

8. An optical receiver, comprising:

a photodiode for receiving an optical signal to generate a photocurrent;

a trans-impedance amplifier for converting the photocurrent into a voltage signal;

a variable gain amplifier for amplifying the voltage signal; and a gain controller for varying a gain of the variable gain amplifier to keep an output of the variable gain amplifier substantially constant, wherein the variable gain amplifier includes, a first stage for amplifying the voltage signal, the first stage including a load resistor, a cascade transistor, a first amplifying transistor and a constant current source each connected in series between a power supply and a ground, the constant current source determining a first current flowing in the load resistor, the cascade transistor, and the amplifying transistor;

a current supplier to extract a second current from the first current flowing in the cascade transistor by supplying the second current to the amplifying transistor; and a current extractor to add a third current to the first current flowing in the load resistor and extracted by the second current.

9. The optical receiver of claim 8, wherein the third current is substantially equal to the second current to set bias conditions of the load resistor constant, independent of the second current and the third current.

10. The optical receiver of claim 9, wherein the first stage, the current supplier, and the current extractor have a differential arrangement.

11. The optical receiver of claim 10, wherein the first stage includes a pair of load resistors, a pair of cascade transistors, a pair of amplifying transistors, and the constant current source, wherein the current supplier includes a pair of transistors, and the current extractor includes a pair of transistors and a constant current source, wherein one of the cascade transistors and one of the transistors of the current supplier constitute a differential circuit with respect to one of the amplifying transistors and the constant current source of the first stage, and one of the amplifying transistors and one of the transistors of the current extractor are commonly connected to one of the load resistors, and wherein the one of the transistors of the current supplier and the one of the transistors of the current extractor are driven by a gain control signal output from the gain controller, and the one of the cascade transistors and another transistor of the current extractor are driven by a constant reference.

12. The optical receiver of claim 11, wherein the constant current source of the current extractor generates a constant current substantially equal to the first current generated by the constant current source of the first stage.

13. The optical receiver of claim 11, further including a second stage with a differential arrangement for amplifying an output of the first stage, and a pair of feedback transistors put between the load resistors and the power supply to form an active load in the first stage, wherein the second stage includes a pair of amplifying transistors and a constant current source for receiving the output of the first stage, and wherein each of the feedback transistors receives an output of the second stage to form a Cherry-Hooper circuit.

14. The optical receiver of claim 11, further including an offset controller for canceling an offset appearing in the output of the variable gain amplifier by receiving the output of the variable gain amplifier and feeding back an output of the offset controller to another of the amplifying transistors.

* * * * *